United States Patent
Mori et al.

(10) Patent No.: US 7,612,336 B2
(45) Date of Patent: Nov. 3, 2009

(54) SCANNING ELECTRON MICROSCOPE HAVING A MONOCHROMATOR

(75) Inventors: Wataru Mori, Hitachinaka (JP); Makoto Ezumi, Mito (JP); Yoichi Ose, Mito (JP)

(73) Assignee: Hitachi High-Technologies Corporation, Tokyo (JP)

( * ) Notice: Subject to any disclaimer, the term of this patent is extended or adjusted under 35 U.S.C. 154(b) by 148 days.

(21) Appl. No.: 11/649,882

(22) Filed: Jan. 5, 2007

(65) Prior Publication Data

US 2007/0181805 A1    Aug. 9, 2007

(30) Foreign Application Priority Data

Jan. 5, 2006    (JP) .............................. 2006-000764

(51) Int. Cl.
*H01J 37/26* (2006.01)

(52) U.S. Cl. ...................... 250/310; 250/306; 250/311; 250/396 R

(58) Field of Classification Search ................. 250/311, 250/310, 305, 396 R, 306, 307, 309; 850/21, 850/26

See application file for complete search history.

(56) References Cited

U.S. PATENT DOCUMENTS

| | | | |
|---|---|---|---|
| 4,225,233 A * | 9/1980 | Ogan | 356/308 |
| 5,126,565 A | 6/1992 | Rose | |
| 5,449,914 A | 9/1995 | Rose et al. | |
| 6,140,645 A | 10/2000 | Tsuno | |
| 6,239,430 B1 | 5/2001 | Weimer et al. | |
| 6,495,826 B2 | 12/2002 | Tsuno | |
| 7,022,983 B2 * | 4/2006 | Ose et al. | 250/305 |
| 2002/0166964 A1 * | 11/2002 | Talbot et al. | 250/307 |
| 2003/0209674 A1 * | 11/2003 | Hamaguchi et al. | 250/396 ML |
| 2004/0188607 A1 * | 9/2004 | Ose et al. | 250/305 |
| 2004/0227078 A1 * | 11/2004 | Koguchi et al. | 250/310 |
| 2006/0043292 A1 * | 3/2006 | Matsui | 250/310 |
| 2006/0097158 A1 * | 5/2006 | Yamaguchi et al. | 250/307 |
| 2006/0108531 A1 * | 5/2006 | Lo et al. | 250/346 |
| 2006/0151698 A1 * | 7/2006 | Sasaki et al. | 250/310 |

FOREIGN PATENT DOCUMENTS

| | | |
|---|---|---|
| JP | 2003-132828 | 5/2003 |
| JP | 2004-214111 | 7/2004 |

* cited by examiner

*Primary Examiner*—Jack I Berman
*Assistant Examiner*—Nicole Ippolito Rausch
(74) *Attorney, Agent, or Firm*—McDermott Will & Emery LLP

(57) ABSTRACT

A scanning electron microscope having a monochromator that can automatically adjust an electron beam entering the monochromator and operating conditions of the monochromator. The scanning electron microscope having a monochromator is equipped with, between an electron source and the monochromator, a first focusing lens for adjusting focusing of the electron beam entering the monochromator and a first astigmatism correcting lens for correcting astigmatism of the electron beam entering the monochromator. The microscope further includes a means of obtaining an image of an electron-beam adjustment sample disposed where the electron beam in the monochromator is focused, and based on the obtained image, driving the first focusing lens and the first astigmatism correcting lens so that the focusing and astigmatism of the electron beam entering the monochromator are adjusted.

5 Claims, 11 Drawing Sheets

SCANNING ELECTRON MICROSCOPE HAVING A MONOCHROMATOR

BACKGROUND OF THE INVENTION

1. Technical Field

The present invention relates to a scanning electron microscope having a monochromator for monochromatizing the energy of an electron beam.

2. Background Art

In a recent scanning electron microscope (SEM: Scanning Electron Microscope), for the purpose of preventing a semiconductor sample or the like from being electrically charged by an electron beam, such electron beam having a low-voltage energy of several keV or lower is often used. In such a low-voltage SEM, an energy width specific to an electron source is relatively large with respect to electron-beam voltage energy. Thus, it is problematic in that a sufficiently small spot diameter cannot be obtained, since blurring is caused due to so-called chroma aberration. In order to solve such a problem associated with the low-voltage SEM, JP Patent Publication (Kokai) No. 2004-214111 A, for example, proposes a scanning electron microscope having a monochromator that selectively passes only an electron beam in a desired energy range.

Based on the monochromator and the SEM proposed in JP Patent Publication (Kokai) No. 2004-214111 A, using a first focusing lens, the electron beam is caused to be incident so that a real image of the electron source is formed on the intersection of a linear optical axis of the electron beam with a symmetry plane of the monochromator. The electron beam is then deflected away from the linear optical axis of the electron beam through a sectorial magnetic field, and the deflected electron beam is further deflected through a sectorial electrical field, whereby energy dispersion is caused. The energy of the electron beam is monochromatized by passing the electron beam through a slit placed in an energy dispersion surface.

SUMMARY OF THE INVENTION

However, since the monochromator and the SEM proposed in JP Patent Publication (Kokai) No. 2004-214111 A do not have a mechanism for adjusting astigmatism of the electron beam entering the monochromator, the following problems arise.

Focusing power of the electron beam is different between the direction in which energy dispersion is generated in the monochromator (the horizontal direction of FIG. 1 of JP Patent Publication (Kokai) No. 2004-214111 A, hereafter referred to as an "x-direction") and the direction perpendicular thereto (the vertical direction of FIG. 1 of JP Patent Publication (Kokai) No. 2004-214111 A, hereafter referred to as a "y-direction"). Thus, when an electron beam having astigmatic difference is caused to be incident on the intersection of the linear optical axis of the electron beam with the symmetry plane of the monochromator, since the electron beam on the energy dispersion surface has not only a width due to energy dispersion but also a spatial width, a desired energy range cannot be selected. In addition, another problem is that the astigmatic difference of the electron beam re-focused in the monochromator is amplified at a virtual image point. The former problem makes it impossible to select an original energy range, and the latter problem deteriorates the performance as a scanning electron microscope. These problems cannot be solved by the method, for example, disclosed in JP Patent Publication (Kokai) No. 2004-214111 A for automatically adjusting the monochromator, and therefore, conventionally, a user has to manually adjust the electron beam entering the monochromator or operating conditions of the monochromator.

The present invention has been made in view of such circumstances, and it is an object of the present invention to provide a scanning electron microscope having a monochromator that can automatically adjust the electron beam entering the monochromator and operating conditions of the monochromator.

As a result of intensive studies in view of the above problems to be solved, the present inventors provides a scanning electron microscope having a monochromator, the microscope comprising: a first focusing lens for adjusting focusing of the electron beam entering the monochromator between an electron source and the monochromator; and a first astigmatism correcting lens for correcting astigmatism of the electron beam entering the monochromator. Further, the present inventors have found that an electron beam in a desired state can be obtained on the energy dispersion surface by obtaining an image of an electron-beam adjustment sample disposed where the electron beam is focused in the monochromator and, based on the obtained image, driving the first focusing lens and the first astigmatism correcting lens, so that the focusing and astigmatism of the electron beam entering the monochromator are adjusted.

Namely, a scanning electron microscope according to the present invention comprises an electron source; an objective lens for focusing the electron beam emitted from the electron source on a sample, and a monochromator for monochromatizing the energy of the electron beam disposed between the electron source and the objective lens. Between the electron source and the monochromator, the scanning electron microscope comprises the first focusing lens for adjusting focusing of the electron beam entering the monochromator and the first astigmatism correcting lens for correcting astigmatism of the electron beam entering the monochromator. The scanning electron microscope further comprises a means of obtaining an image of the electron-beam adjustment sample disposed where the electron beam is focused in the monochromator and, based on the obtained image, driving the first focusing lens and the first astigmatism correcting lens, so that the focusing and astigmatism are adjusted.

The scanning electron microscope of the present invention comprises a means of adjusting an optical axis by using the adjustment sample having an opening as the electron beam-adjustment sample and allowing the electron beam to pass through the opening, in cases in which the present invention is used as a scanning electron microscope that does not use the monochromator.

The scanning electron microscope of the present invention comprises a second astigmatism correcting lens for adjusting astigmatism on the sample surface between the monochromator and the objective lens.

In the scanning electron microscope of the present invention, the adjustment means measures an edge inclination of the obtained image in the x-direction in which energy dispersion is generated in the monochromator and in the y-direction that is perpendicular to the x-direction and the direction of electron-beam emission. The adjustment means makes an adjustment based on results of the measurement.

In the scanning electron microscope of the present invention, the adjustment means makes an adjustment based on a comparison between the obtained image and a previously stored template.

Effects of the Invention

As described above, according to the present invention, based on the scanning electron microscope having a monochromator, it becomes possible to automatically adjust the electron beam entering the monochromator and operating conditions of the monochromator.

Figure 1:
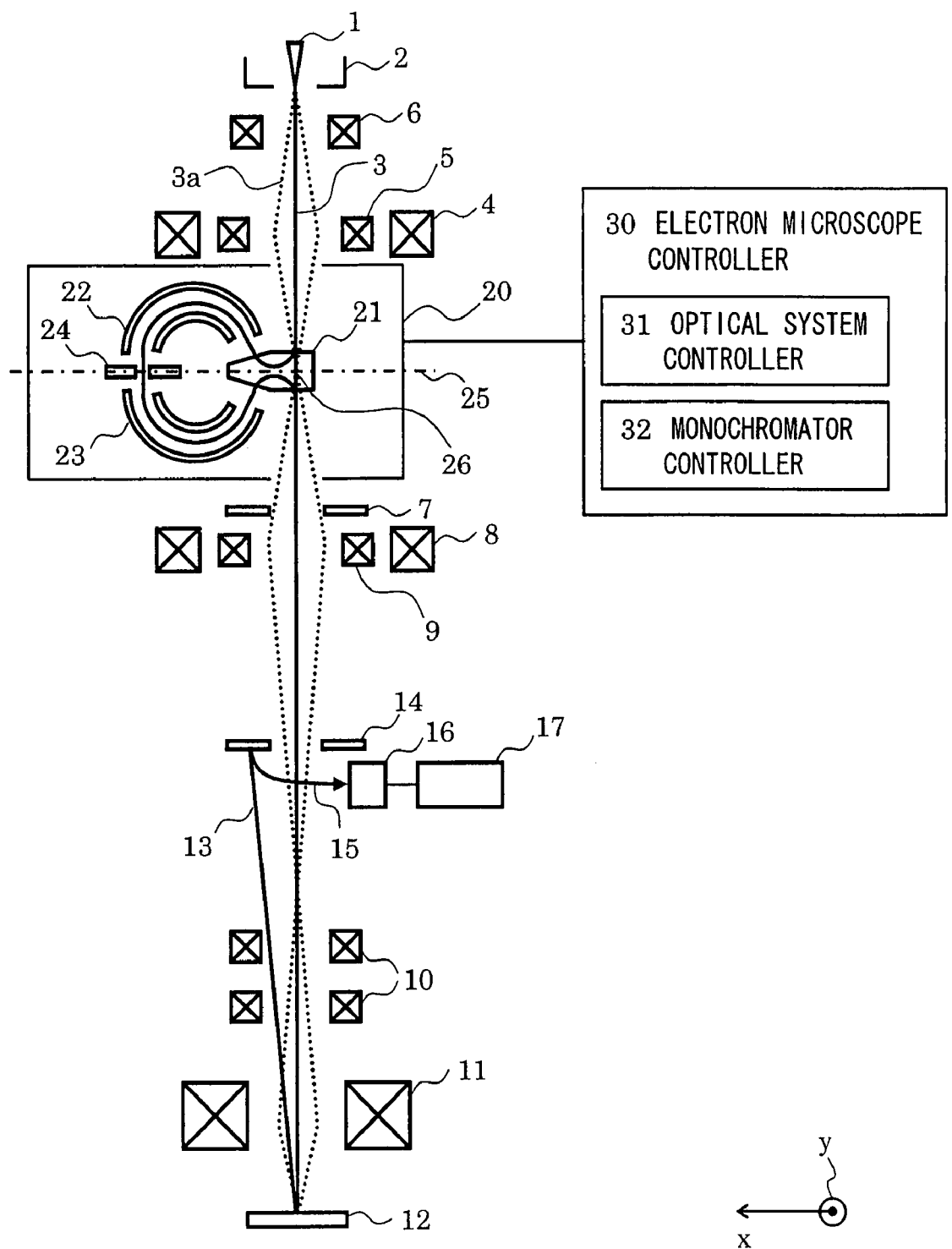
FIG. 1 shows a schematic structure of the scanning electron microscope having a monochromator on a linear optical axis of an electron beam according to an embodiment of the present invention.

DESCRIPTION OF PREFERRED
EMBODIMENTS OF THE INVENTION

Preferred embodiments of a scanning electron microscope having a monochromator of the present invention will be hereafter described in detail with reference to the attached drawings. FIGS. 1 to 11 exemplify embodiments of the present invention, in which elements designated by identical reference characters indicate identical elements and basic structures and operations of such elements are identical to each other.

FIG. 1 shows a schematic structure of the scanning electron microscope having a monochromator on a linear optical axis of an electron beam according to an embodiment of the present invention. In FIG. 1, the scanning electron microscope comprises an electron source 1, an anode electrode 2, a first focusing lens 4, a first astigmatism correcting lens 5, an alignment coil 6, an aperture 7, a second focusing lens 8, a second astigmatism correcting lens 9, scanning deflection coils 10, an objective lens 11, a conversion electrode 14, a scintillator 16, a photomultiplier tube 17, a monochromator 20 disposed in the light path of an electron beam 3 emitted from the electron source 1, and a controller 30 connected to the monochromator 20. Among these component parts, the parts identical to those in a conventional technology disclosed in JP Patent Publication (Kokai) No. 2004-214111 A or the like are similarly structured and operated.

Figure 2:
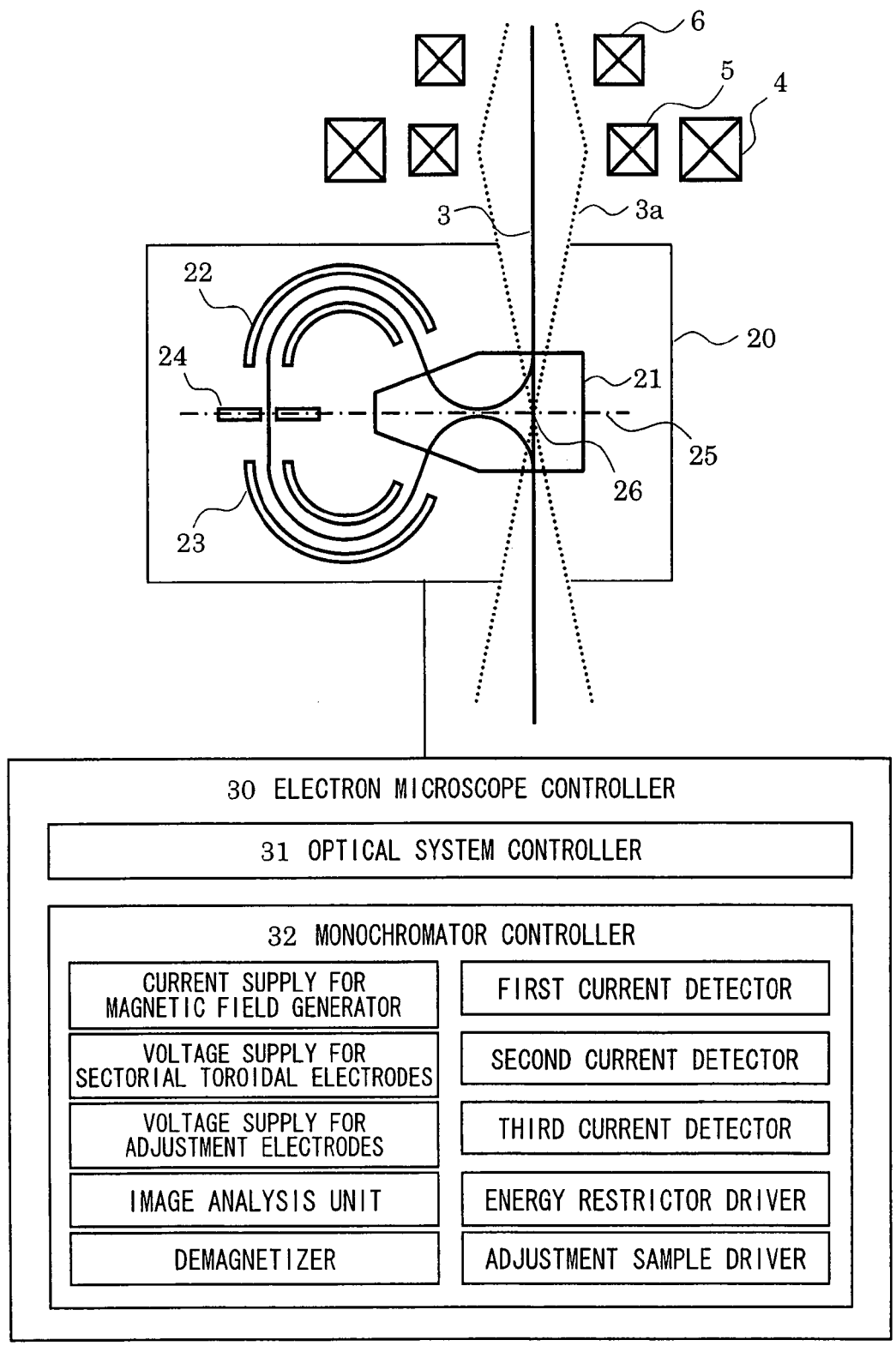
FIG. 2 shows an internal structure and adjoining parts of the monochromator of FIG. 1 in detail.

FIG. 2 shows an internal structure and adjoining parts of the monochromator 20 of FIG. 1 in detail. In FIG. 2, the monochromator 20 comprises a magnetic field generator 21, a first electrical field generator 22, a second electrical field generator 23, and an energy restrictor 24. As illustrated, the internal structure of the monochromator 20 is symmetrical with respect to a plane 25 (a plane parallel to the x-direction and the y-direction) including the energy restrictor 24. This plane 25 will be hereafter referred to as a "symmetry plane 25 of the monochromator 20."

Figure 4:
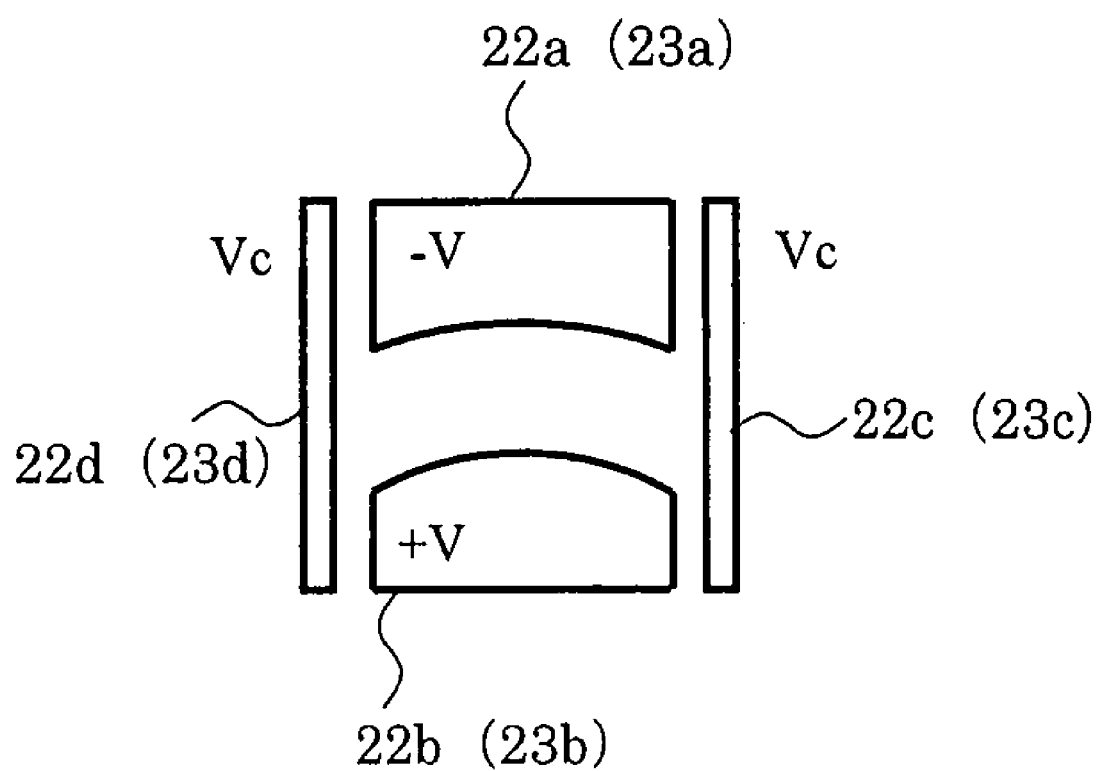
FIG. 4 shows cross-sectional views of a first electrical field generator and a second electrical field generator disposed in the monochromator shown in FIGS. 1 and 2.

Referring to FIGS. 2 and 4, a monochromator controller 32 comprises a magnetic-field-generator current supply for adjusting an excitation current flowing through the magnetic field generator 21, a demagnetizer for eliminating the residual magnetic field of the magnetic field generator 21, a sectorial-toroidal-electrode voltage supply for adjusting voltages applied to sectorial toroidal electrodes 22a, 22b, 23a, and 23b of the first electrical field generator 22 and the second electrical field generator 23, an adjustment-electrode voltage supply for adjusting voltages applied to adjusting electrodes 22c, 22d, 23c, and 23d, an energy restrictor driver for moving the energy restrictor 24 in a two dimensional manner, and an adjustment sample driver for moving an adjustment sample 26 away from the linear optical axis of the electron beam. Further, the monochromator controller 32 comprises a first current detector for detecting a current flowing through the first electrical field generator 22, a second current detector for detecting a current flowing through the second electrical field generator 23, a third current detector for detecting a current that has passed through the monochromator 20, and an image analysis unit for analyzing an SEM image.

In FIGS. 1 and 2, the magnetic field generator 21 in the monochromator 20 comprises a first incident end face on which the electron beam 3 from the linear optical axis is incident, a first exit end face from which the electron beam 3 incident on the first incident end face is emitted, a second incident end face on which the electron beam 3 deflected by the second electrical field generator 23 is incident, and a second exit end face from which the electron beam 3 incident on the second incident end face is emitted along the linear optical axis.

Figure 3:
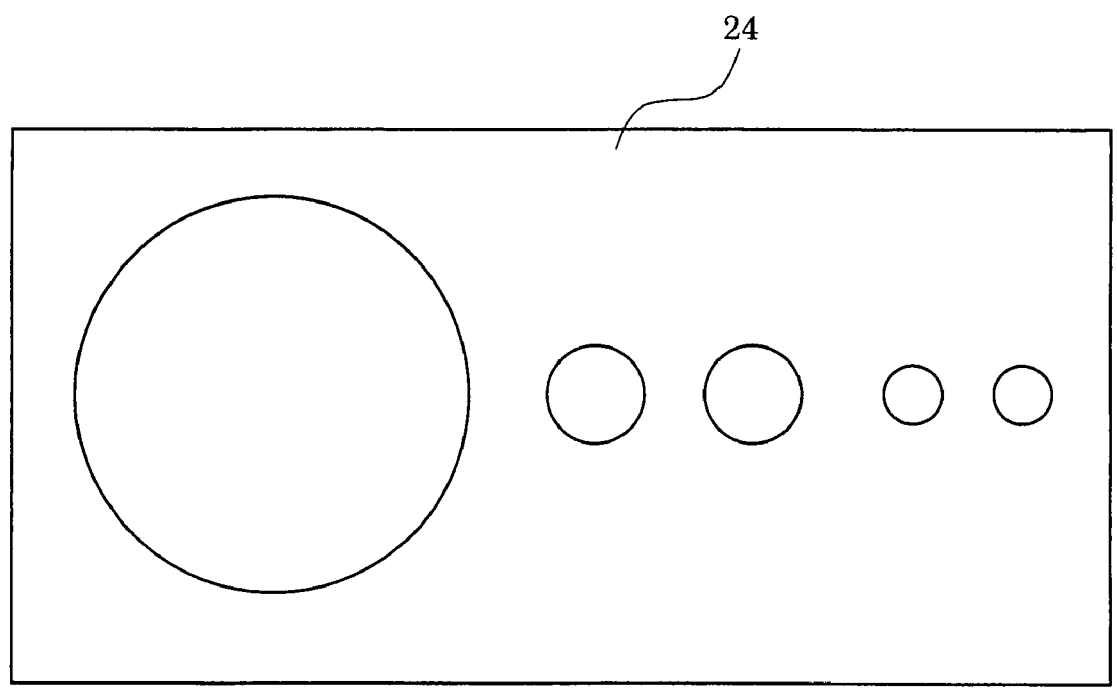
FIG. 3 shows an energy restrictor with which the monochromator shown in FIGS. 1 and 2 are provided.

The energy restrictor 24 in the monochromator 20 has several types of apertures having diameters identical to or different from each other. A desired energy range can be narrowed by using a smaller aperture diameter. For example, in the scanning electron microscope of the present embodiment, it has been confirmed that use of an aperture with a diameter of 3 μm can achieve about one third of an original energy range. Further, the energy restrictor 24 also comprises an aperture for observing a state of electron-beam energy dispersion, and this aperture has a diameter larger than an energy-dispersed electron beam. For example, in the scanning electron microscope of the present embodiment, in cases in which an electron-beam shape is about 10 μm in the x-direction and about 0.6 μm in the y-direction when energy dispersion is caused, an aperture having a diameter of 20 μm is used for observing the electron beam. FIG. 3 shows such energy restrictor 24 having a plurality of apertures with diameters identical to or different from each other. Note that it is desirable that the energy restrictor 24 be heated by a heater or the like for preventing contamination.

FIG. 4 shows cross-sectional views of the first electrical field generator 22 and the second electrical field generator 23 disposed in the monochromator 20 shown in FIGS. 1 and 2. In FIG. 4, a structure of the first electrical field generator 22 on the upper side of the symmetry plane 25 of the monochromator 20 is shown. However, a structure of the second electrical field generator 23 that is symmetrical to the first electrical field generator 22 with respect to the symmetry plane 25 should be easily understood from the figure. In FIG. 4, the first electrical field generator 22 (or the second electrical field generator 23) comprises an outer sectorial toroidal electrode 22a (or 23a) and an inner sectorial toroidal electrode 22b (or 23b) that sandwich the electron beam. For finely adjusting a sectorial toroidal electrical field, two adjustment electrodes 22c and 22d (or 23c and 23d) are installed near both ends of the toroidal electrodes 22a and 22b in the y-direction.

An operation of the scanning electron microscope having a monochromator structured in the above manner will be hereafter described.

Referring to FIG. 1, when an extraction voltage is applied between the electron source 1 and the anode electrode 2, the electron beam 3 is emitted from the electron source 1 along a linear optical axis. The electron beam 3 includes an electron beam 3a widening to several dozen millirads, and a real image of the electron source 1 is point-focused on the intersection of the symmetry plane 25 of the monochromator 20 with the linear optical axis, using the first focusing lens 4. Next, the electron beam 3 emitted from the electron source 1 is deflected by the magnetic field generator 21 in a former deflection system that deflects the electron beam 3 to the energy restrictor 24, so that the beam has an angle of about 160 degrees, and the electron beam 3 is then deflected by the same degree in the opposite direction by the first electrical field generator 22. As a result of this deflection, the electron beam 3 is caused to have a direction parallel to the initial linear optical axis, and the energy is dispersed in the x-direction and focused in the y-direction at the energy restrictor 24 disposed on the energy dispersion surface.

Next, the electron beam 3 travels along a symmetrical path and is point-focused by the second electrical field generator 23 in a latter deflection system installed at the position symmetrical to the plane containing the energy restrictor 24 and that deflects the electron beam 3 so that the electron beam 3 is again along the linear optical axis of the electron beam, and the magnetic field generator 21. A non-dispersive virtual image is formed by cancelling the energy dispersion generated in the former deflection system. After this single-colored (monochromatized) virtual image of the electron source is formed by the second focusing lens 8, the size of the image is reduced by the objective lens 11, so as to form a minute crossover on the surface of a sample 12. At this point, the divergence angle of the electron beam 3 or the amount of the electron beam current is limited by the aperture 7 installed between the monochromator 20 and the objective lens 11. Further, this electron beam 3 scans the sample 12 in a two dimensional manner with the scanning deflection coils 10.

Electrons 13 (secondary electrons and/or reflection electrons) emitted from the sample 12 move upwards due to a lens effect of the objective lens 11. The rising electrons 13 collide against the conversion electrode 14, thereby generating other secondary electrons 15. These secondary electrons 15 emit light when they collide against the scintillator 16 to which a positive high voltage is applied. After the secondary electrons 15 are converted into electrical signals and are amplified by the photomultiplier tube 17, they can be observed as a scanning electron microscope image (SEM image). In order to adjust astigmatism when the image is observed, the second astigmatic correcting lens 9 installed between the monochromator 20 and the objective lens 11 is used. Note that the electrons emitted from the sample 12 may be directly guided to a detector such as the scintillator 16.

Figure 5:
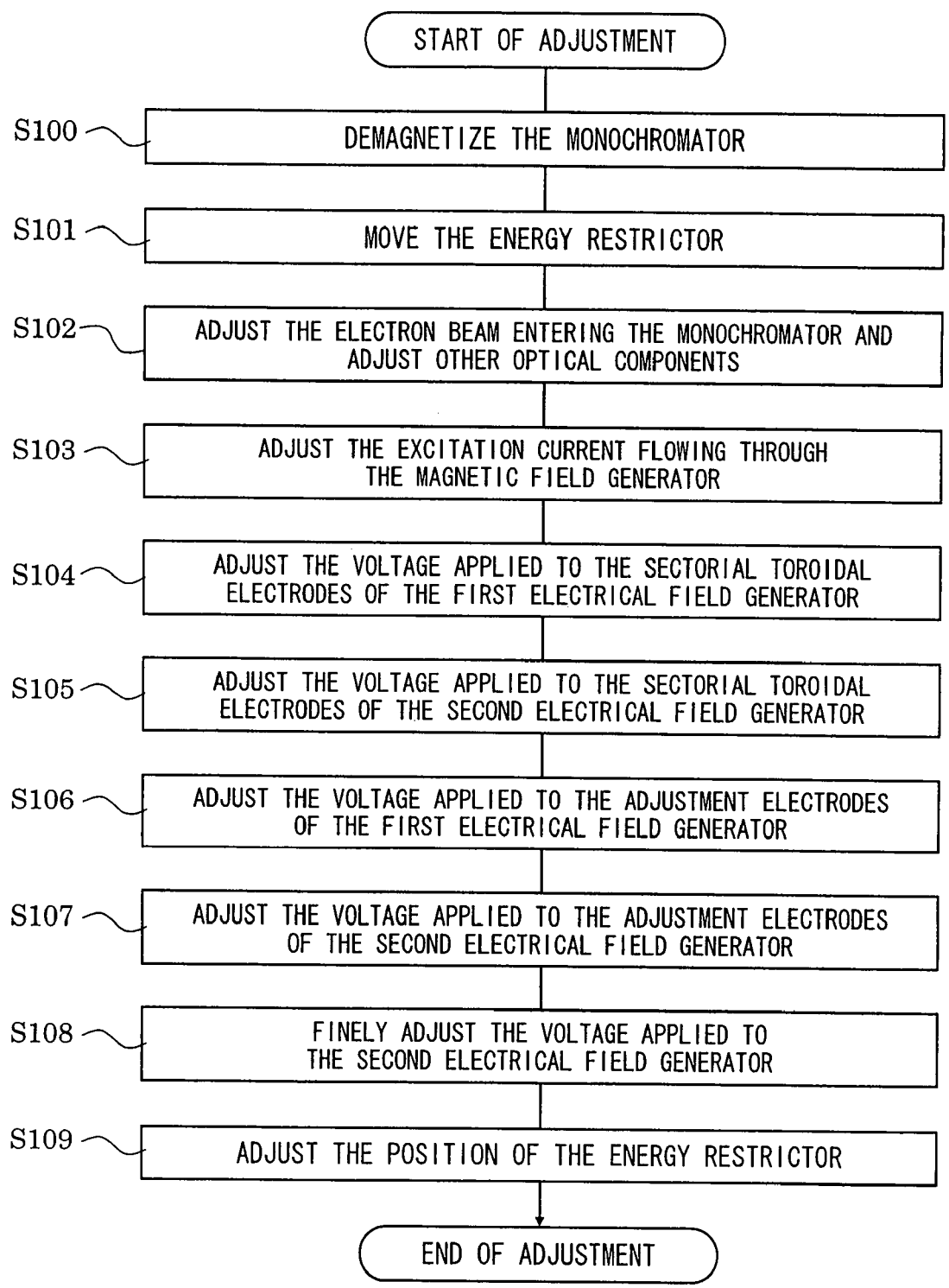
FIG. 5 shows a flow chart of the processing for automatically adjusting operating conditions of the scanning electron microscope and the monochromator shown in FIGS. 1 and 2.

Next, a method for automatically adjusting operating conditions of the above scanning electron microscope and monochromator will be described. FIG. 5 shows a flow chart of the processing for automatically adjusting operating conditions of the scanning electron microscope and the monochromator in the present embodiment.

Referring to FIG. 5, first, applied voltages and currents to individual components of the monochromator 20 are cut off, and residual magnetic fields in the monochromator 20 are eliminated (S100). If a magnetic field remains in the monochromator 20, the electron beam 3 is subjected to a deflection effect in the monochromator 20, whereby it becomes impossible to make adjustments to the optical axis.

Subsequently, the energy restrictor 24 is moved away from the electron beam path by using the energy restrictor driver of the monochromator controller 32 (S101). Examples of the method for moving the energy restrictor 24 include methods utilizing a piezoelectric element, a motor, or compressed air.

Subsequently, based on an optical system controller 31, the incident electron beam entering the monochromator 20 is adjusted with the first focusing lens and the first astigmatism correcting lens, and the optical axis adjustment of other optical components is made. First, an adjustment for causing the electron beam to enter the monochromator 20 is made. With the use of the first focusing lens 4 and alignment coil 6, an real image of the electron source is point-focused on the electron-beam adjustment sample 26 that is capable of adjusting both focusing and astigmatism and that is located at the intersection of the symmetry plane 25 of the monochromator 20 with the linear optical axis of the electron beam. In order to determine if the beam has been focused on a desired point, the electron beam 3 is caused to scan the adjustment sample 26 in a two dimensional manner with the alignment coil 6, and an SEM image of the adjustment sample 26 is obtained. Excitation currents of the first focusing lens 4 and the first astigmatic correcting lens 5 are adjusted so that optimum conditions can be acquired, by measuring an edge inclination in the x-direction and the y-direction of the SEM image obtained by the image analysis unit of the monochromator controller 32 or by measuring the amount of deviation through a search using an existing template. It is desirable that material for the adjustment sample 26 be electrically conductive to prevent the electron beam 3 from being charged up.

Figure 6:
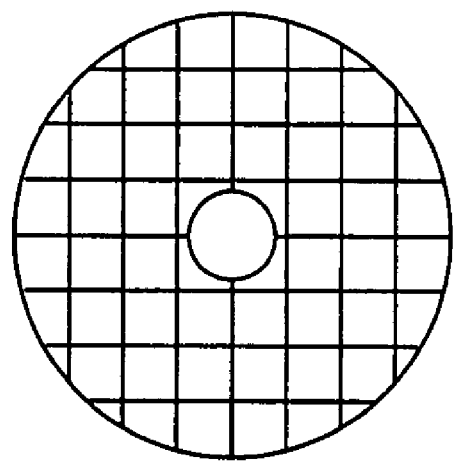
FIG. 6 shows a schematic structure of an adjustment sample fixed to a symmetry plane of the monochromator in FIG. 2.
Figure 6:
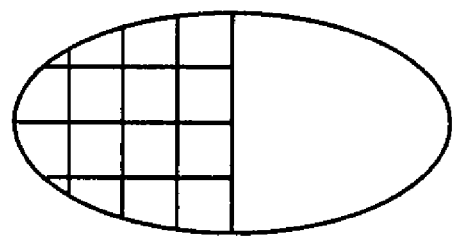
Figure 7:
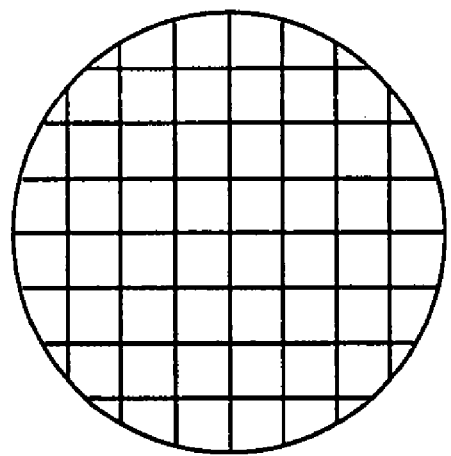
FIG. 7 shows a schematic structure of an adjustment sample fixed to the symmetry plane of the monochromator in FIG. 2.
Figure 7:
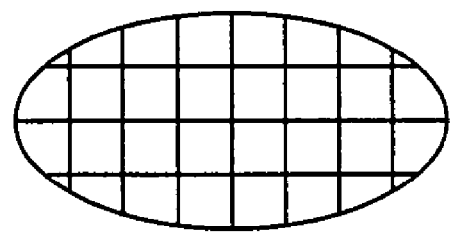

Regarding the shape of the adjustment sample 26 when the adjustment sample 26 is fixed on the symmetry plane 25 of the monochromator 20, assuming cases in which the present invention is also used as a normal scanning electron microscope that does not monochromatize the electron beam, a mesh having an opening in the center thereof as shown in FIG. 6 is suitable, for example. When the focusing and astigmatism of the electron beam are adjusted by using such mesh, an electric current is caused to flow through the alignment coil 6, so as to move the electron beam away from the center of the adjustment sample 26 to the mesh side. Upon completion of the adjustment of the electron beam, the current flowing through the alignment coil 6 is simply cut off. Further, in the case of a method by which the adjustment sample 26 is moved away from the linear optical axis of the electron beam, an adjustment sample having no opening in the center thereof as shown in FIG. 7 may be used.

While the adjustment sample driver of the monochromator controller 32 is a means of moving the adjustment sample 26, the driver may utilize a piezoelectric element, a motor, compressed air, or the like. Equipped with such adjustment sample driver, the adjustment sample 26 can be moved to or away from the intersection of the symmetry plane 25 of the monochromator 20 with the linear optical axis of the electron beam. While the method for adjusting the first focusing lens 4 and the first astigmatism correcting lens 5 with the monochromator 20 has been describe above, even when the present invention is used as a normal scanning electron microscope without using the monochromator 20, the same conditions may apply to the first focusing lens 4 and the first astigmatic correcting lens 5.

Next, the adjustment of the optical axis is made by the aperture 7 and the second focusing lens 8. Further, by adjusting the objective lens 11 or the second astigmatism correcting lens 9, conditions on which an SEM image resolution can be obtained are adjusted. The above adjustment (S102) completes the adjustment of the scanning electron microscope prior to use of the monochromator.

A method for automatically adjusting individual components of the monochromator will be hereafter described.

Figure 8:
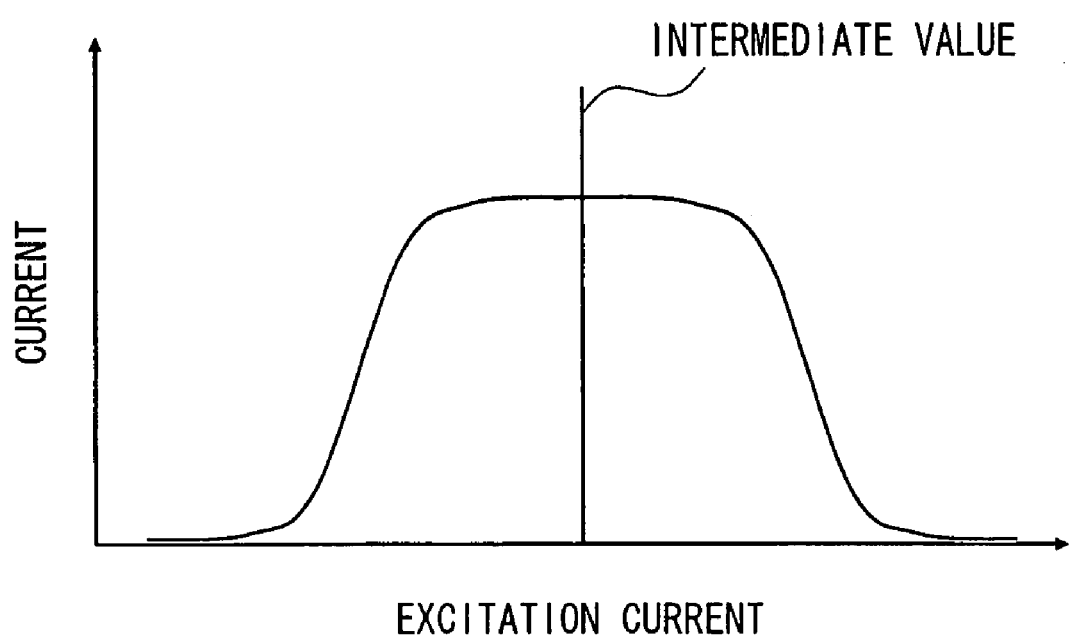
FIG. 8 shows measurement results of a current entering the first electrical field generator with the use of a first current detector of the monochromator controller shown in FIG. 2.

First, an excitation current flowing through the magnetic field generator 21 is adjusted (S103). The electron beam 3 is deflected by the magnetic field generator 21 in the former deflection system, so that it has an angle of 160 degrees, and the electron beam 3 then enters the first electrical field generator 22. If the excitation current flowing through the magnetic field generator 21 is changed, the electron beam 3 enters the first electrical field generator 22 only when the excitation current is in a certain range. Thus, by measuring the current with the first current detector of the monochromator controller 32, it can be determined whether or not the electron beam 3 has entered the first electrical field generator 22. FIG. 8 shows an example of results of such measurement. The magnetic-field-generator current supply and the first current detector of the monochromator controller 32 are controlled so as to measure the current, and an intermediate value of the measured current range is set as the excitation current flowing through the magnetic field generator 21.

Figure 9:
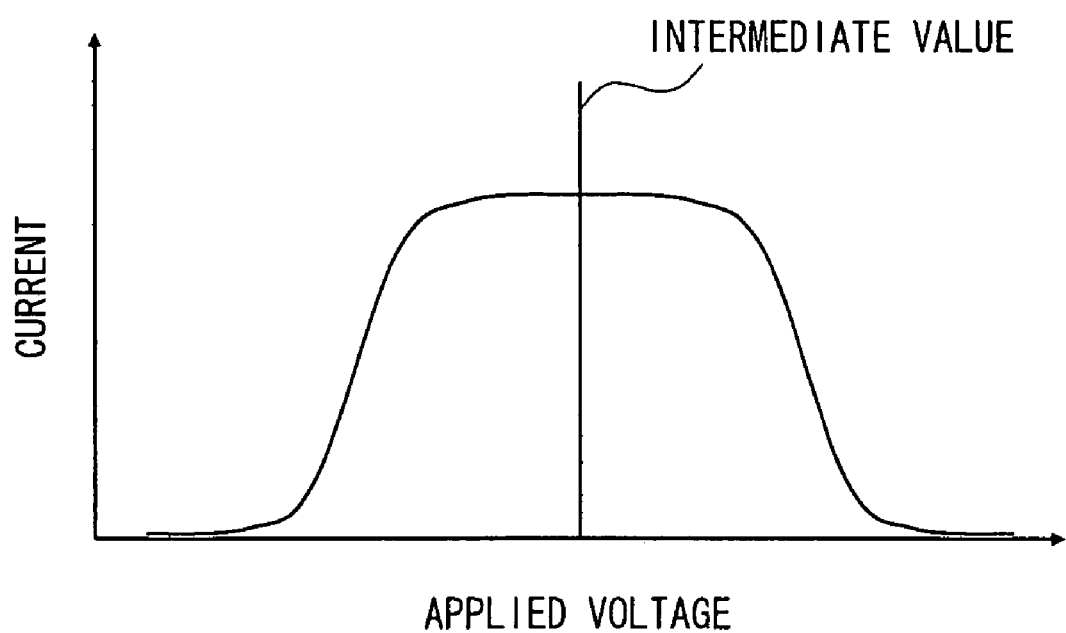
FIG. 9 shows measurement results of a current entering the second electrical field generator with the use of a second current detector of the monochromator controller shown in FIG. 2.

Next, a voltage applied to the first sectorial toroidal electrodes 22a and 22b of the first electrical field generator 22 is adjusted (S104). The electron beam 3 that has entered the first electrical field generator 22 is guided into the second electrical field generator 23 due to an electrical field generated by the first electrical field generator 22. If the voltage applied to the first sectorial toroidal electrodes 22a and 22b of the first electrical field generator 22 is changed, the electron beam 3 enters the second electrical field generator 23 only when the voltage is in a certain range. Thus, by measuring the current with the second current detector of the monochromator controller 32, it can be determined whether or not the electron beam 3 has entered the second electrical field generator 23. FIG. 9 shows an example of results of such measurement. The current flowing through the first electrical field generator 22 is measured by controlling the sectorial-toroidal-electrode voltage supply and the second current detector of the monochromator controller 32, and an intermediate value of the measured current range is set as the voltage applied to the first sectorial toroidal electrodes 22a and 22b of the first electrical field generator 22.

Next, a voltage applied to the second sectorial toroidal electrodes 23a and 23b of the second electrical field generator 23 is adjusted (S105). The electron beam 3 that has entered the second electrical field generator 23 is again deflected due to an electrical field generated by the second electrical field generator 23, and it is guided to the magnetic field generator 21 for directing the beam along the linear optical axis of the electron beam as in a normal scanning electron microscope. Since the upper portion of the monochromator 20 and the lower portion thereof are structured symmetrical to each other, the voltage applied to the second sectorial toroidal electrodes 23a and 23b of the second electrical field generator 23 is set in the same way as the voltage applied to the first sectorial toroidal electrodes 22a and 22b of the first electrical field generator 22.

Figure 10:
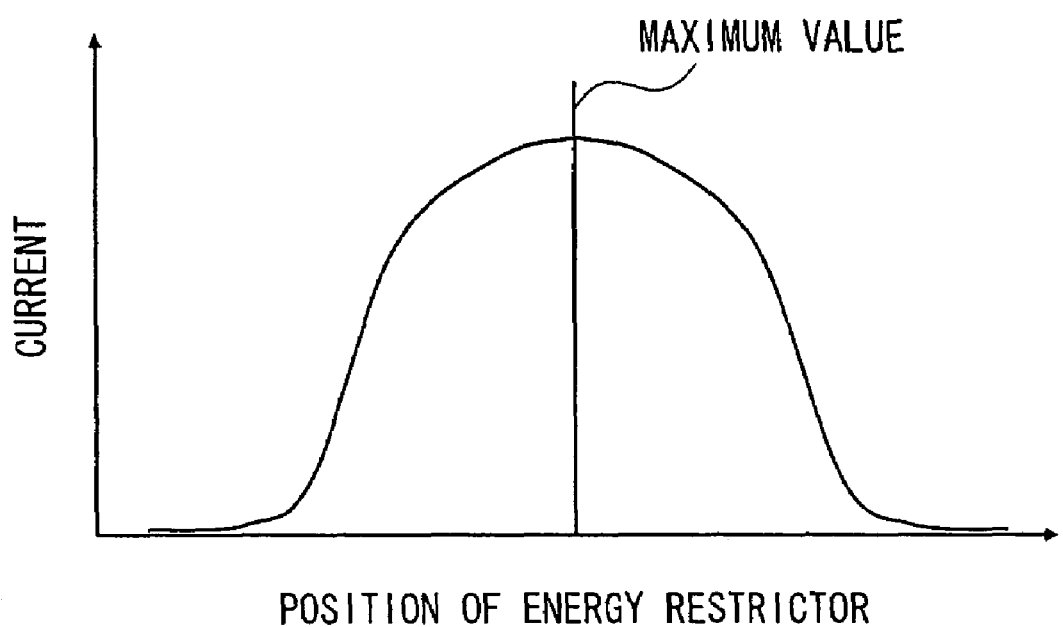
FIG. 10 shows measurement results of a current passing through the monochromator with the use of a third current detector of the monochromator controller shown in FIG. 2.

Next, fine adjustment is made to the focusing in the y-direction with two first adjustment electrodes 22c and 22d with which the first electrical field generator 22 is provided (S106). For this fine adjustment, an aperture for energy dispersion observation of the electron beam above the energy restrictor 24 is used. Specifically, the aperture for energy dispersion observation of the electron beam is inserted in the energy dispersion surface of the electron beam 3 above the energy restrictor 24, and it is then moved to a previously registered position by the energy restrictor driver of the monochromator controller 32. Since the amount of the current passing through the monochromator 20 changes when the aperture for observation is moved, the amount of the current that can be measured by the third current detector of the monochromator controller 32 also changes. FIG. 10 shows an example of results of such measurement. A current is measured by controlling the energy restrictor driver and the third current detector with the monochromator controller 32, and the position of the aperture for observation is finely adjusted, so that the current measured becomes maximum.

The method for finely adjusting the position of the aperture for observation may be conducted as follows. The excitation current flowing through the magnetic field generator 21 and the voltage applied to the first sectorial toroidal electrodes 22a and 22b of the first electrical field generator 22 are set. When the aperture for observation is moved, since the amount of the current that can be measured by the second current detector becomes such as shown in FIG. 10, the current is measured by controlling the energy restrictor driver and the second current detector with the monochromator controller 32, and the position of the aperture for observation is finely adjusted, so that the current measured becomes maximum.

Figure 11:
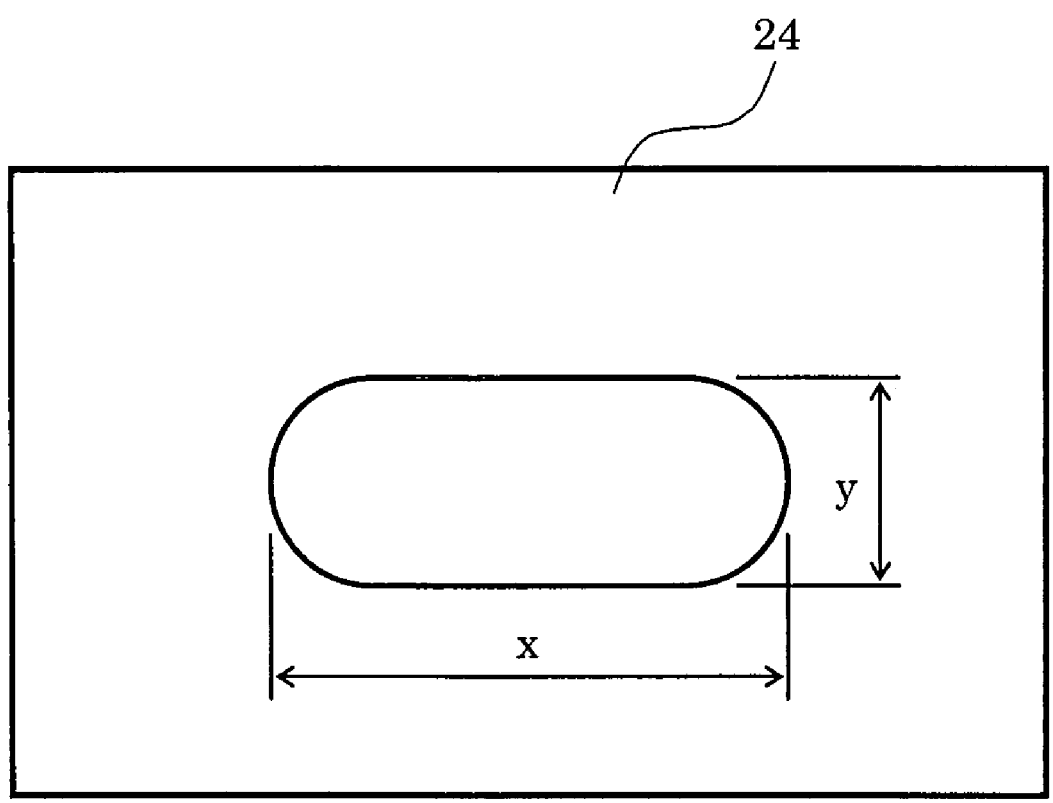
FIG. 11 shows an SEM image exhibiting an electron-beam shape obtained on an aperture for energy dispersion observation of the electron beam.

Upon completion of the adjustment of the position of the aperture for observation, in order to make an adjustment to the first adjustment electrodes 22c and 22d, the excitation current flowing through the magnetic field generator 21 and the voltage applied to the first sectorial toroidal electrodes 22a and 22b of the first electrical field generator 22 and the second sectorial toroidal electrodes 23a and 23b of the second electrical field generator 23 are set. Scanning is conducted by using the alignment coil 6 on the surface of the aperture for energy dispersion observation of the electron beam in the two dimensional manner, and an SEM image exhibiting an electron-beam shape shown in FIG. 11 is obtained. Using the image analysis unit, the ratio of the electron beam width in the x-direction to that in the y-direction is calculated based on the obtained SEM image, and the voltage applied to the first adjusting electrodes 22c and 22d is adjusted by the adjustment-electrode voltage supply of the monochromator controller 32 so that the ratio becomes a previously registered ratio of the electron beam in the x-direction to that in the y-direction when energy dispersion is caused.

The shape of the electron beam is expressed by the sum of the size of the electron beam and the diameter of the aperture for observation used. In the present embodiment, since the electron beam is about 10 μm in the x-direction and about 0.6

µm in the y-direction, and the aperture used has a diameter of 20 µm, it is preferable that adjustments be made so that x:y=3:2.

Upon completion of the adjustment of the first adjusting electrodes 22c and 22d, the energy restrictor 24 is moved away from the electron-beam path with the energy restrictor driver.

Next, a voltage applied to the second adjustment electrodes 23c and 23d with which the second electrical field generator 23 is provided is set (S107). Since the upper portion of the monochromator 20 and the lower portion thereof are structured symmetrical to each other, the voltage applied to the second adjustment electrodes 23c and 23d of the second electrical field generator 23 is set in the same manner as the voltage applied to the first adjustment electrodes 22c and 22d of the first electrical field generator 22.

Next, fine adjustments are made to the voltage applied to the second electrical field generator 23, so that the optical axis path of the electron beam 3 that has passed through the monochromator 20 becomes the same as the linear optical axis of the electron beam as in a normal scanning electron microscope (S108). First, an SEM image of a sample is obtained, and it is then compared with the SEM image of the sample in S102 by using the image analysis unit of the monochromator controller 32. Next, the voltage applied to the second electrical field generator 23 is finely adjusted with the sectorial-toroidal-electrode voltage supply and the adjustment-electrode voltage supply, so that a focal shift and an image shift become minimum. Alternatively, as described in S106, the voltage applied to the second electrical field generator 23 is finely adjusted so that the current measured by the third current detector becomes maximum.

Upon completion of the setting of the magnetic field generator 21, the first electrical field generator 22, and the second electrical field generator 23 of the monochromator, by using the energy restrictor driver, the energy restrictor 24 is inserted in the energy dispersion surface of the electron beam, so as to make an adjustment to the position of the energy restrictor 24 (S109). First, the energy restrictor 24 is inserted in the energy dispersion surface of the electron beam 3, and it is then moved to a previously registered position with the energy restrictor driver. When the energy restrictor 24 is moved, the amount of the current passing through the monochromator 20 changes. Thus, since the amount of the current that can be measured by the third current detector becomes such as shown in FIG. 10, the current is measured by controlling the energy restrictor driver and the third current detector with the monochromator controller 32, and the position of the energy restrictor 24 is finely adjusted, so that the current measured becomes maximum. Alternatively, the quantity of the secondary electrons 13 emitted from the sample 12 is measured, and the position of the energy restrictor 24 is finely adjusted so that the quantity of the secondary electrons measured becomes maximum.

The fine adjustment of the position of the energy restrictor 24 may be made as follows. First, the excitation current flowing through the magnetic field generator 21 and the voltage applied to the first electrical field generator 22 are set. Since the amount of the current that can be measured by the second current detector becomes such as shown in FIG. 10 when the energy restrictor 24 is moved, the current is measured by controlling the energy restrictor driver and the second current detector with the monochromator controller 32, and the position of the aperture for observation is finely adjusted so that the current measured becomes maximum.

The automatic adjustment of the scanning electron microscope having a monochromator has thus been completed. Next, an adjustment procedure for changing the aperture opening of the energy restrictor 24 will be described. First, a coarse adjustment of the position of the energy restrictor 24 is made. By using the energy restrictor driver, the energy restrictor 24 is moved to a position previously registered in the electron microscope controller 30. For the fine adjustment of the position of the energy restrictor 24, an SEM image of a sample is obtained, and an image previously registered in the image analysis unit is compared with the obtained image. Based on results of the comparison, an adjustment is made using the energy restrictor driver. Alternatively, the fine adjustment method described in S109 may be used.

In accordance with the method described above, it becomes possible to automatically adjust a normal scanning electron microscope that does not use an energy restrictor or a scanning electron microscope that uses a monochromator.

While the scanning electron microscope having a monochromator of the present invention has thus been described based on specific embodiments, the present invention is not limited to the above embodiments. A person skilled in the art can add various changes/modifications to the constitution and functions of each of the above embodiments and other embodiments without departing from the scope of the present invention.

What is claimed is:

1. A scanning electron microscope comprising:
   an electron source;
   an objective lens for focusing an electron beam emitted from the electron source on a sample;
   a monochromator that is disposed between the electron source and the objective lens and that monochromatizes energy of the electron beam,
   a first scanning deflector that is disposed between the monochromator and the sample,
   a first focusing lens for adjusting focusing of the electron beam entering the monochromator;
   a first astigmatism correcting lens for correcting astigmatism of the electron beam entering the monochromator,
   a second scanning deflector for scanning the electron beam on an electron-beam adjustment sample disposed where the electron beam is focused in the monochromator, wherein the first focusing lens, the first astigmatism correcting lens and the second scanning deflector are between the electron source and the monochromator; and
   a controller for controlling the first focusing lens and the first astigmatism correcting lens based on an image that is obtained by the second scanning deflector's scanning.

2. The scanning electron microscope according to claim 1, further comprising a means of adjusting the electron beam by using an adjustment sample having an opening as the electron-beam adjustment sample and by allowing the electron beam to pass through the opening, in cases in which the scanning electron microscope is used as a scanning electron microscope that does not use the monochromator.

3. The scanning electron microscope according to claim 1, further comprising a second astigmatism correcting lens for adjusting astigmatism on the surface of the sample between the monoebromator and the objective lens.

4. The scanning electron microscope according to claim 1, wherein the controller measures an edge inclination of the obtained image in an x-direction in which energy dispersion is caused in the monochromator and in a y-direction that is perpendicular to the x-direction and a direction of electron-beam emission, and the adjustment means makes an adjustment based on results of the measurement.

5. The scanning electron microscope according to claim 1, wherein the controller makes an adjustment based on a comparison between the obtained image and a previously stored template.

\* \* \* \* \*